United States Patent
Sun

(10) Patent No.: US 11,793,056 B2
(45) Date of Patent: Oct. 17, 2023

(54) OLED DEVICE STRUCTURE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 751 days.

(21) Appl. No.: 16/958,764

(22) PCT Filed: Apr. 22, 2020

(86) PCT No.: PCT/CN2020/086019
§ 371 (c)(1),
(2) Date: Jun. 29, 2020

(87) PCT Pub. No.: WO2021/139038
PCT Pub. Date: Jul. 15, 2021

(65) Prior Publication Data
US 2023/0157140 A1    May 18, 2023

(30) Foreign Application Priority Data
Jan. 6, 2020 (CN) .......................... 202010008368.8

(51) Int. Cl.
*H10K 59/80* (2023.01)
*H10K 77/10* (2023.01)
(Continued)

(52) U.S. Cl.
CPC ......... *H10K 59/8794* (2023.02); *H10K 71/00* (2023.02); *H10K 77/111* (2023.02); *H10K 59/40* (2023.02); *H10K 2102/311* (2023.02)

(58) Field of Classification Search
None
See application file for complete search history.

(56) References Cited

U.S. PATENT DOCUMENTS 10,212,811 B1 *  2/2019  Zhang ................. H10K 59/12
11,353,929 B2 *  6/2022  Zhu ...................... G06F 1/1652
(Continued)

FOREIGN PATENT DOCUMENTS

CN        104966790 A     10/2015
CN        106531902 A      3/2017
(Continued)

OTHER PUBLICATIONS

Zeng, Xiaoliang, et al. "A Combination of Boron Nitride Nanotubes and Cellulose Nanofibers for the Preparation of a Nanocomposite with High Thermal Conductivity." ACS Nano, vol. 11, No. 5, 2017, pp. 5167-5178, https://doi.org/10.1021/acsnano.7b02359. (Year: 2017).*

(Continued)

*Primary Examiner* — J. E. Schoenholtz
(74) *Attorney, Agent, or Firm* — PV IP PC; Wei Te Chung; Zhigang Ma

(57) ABSTRACT

An organic light emitting diode (OLED) device structure and a manufacturing method thereof are provided. The OLED device structure includes a base layer, an array segment film layer, an organic light emitting layer, a thin film packing layer, a touch layer, a polarizer, a cover glass, a composite material layer, and a foam copper foil layer. The OLED device structure can solve problems of low penetra- (Continued)

tion rate, poor heat dissipation, buffer layers are easy to peel, and easy breakage in backplane layers of current OLED panels.

10 Claims, 6 Drawing Sheets

(51) Int. Cl.
*H10K 71/00* (2023.01)
*H10K 102/00* (2023.01)
*H10K 59/40* (2023.01)

(56) References Cited

U.S. PATENT DOCUMENTS

| | | | |
|---|---|---|---|
| 2009/0302295 A1 | 12/2009 | Schwartz et al. | |
| 2020/0251677 A1* | 8/2020 | Wang | H01L 23/373 |
| 2020/0341576 A1* | 10/2020 | Kahng | G06F 3/0412 |
| 2022/0376216 A1* | 11/2022 | Zhao | H10K 59/87 |

FOREIGN PATENT DOCUMENTS

| | | |
|---|---|---|
| CN | 106977773 A | 7/2017 |
| CN | 107099045 A | 8/2017 |
| CN | 108447886 A | 8/2018 |
| CN | 109627471 A | 4/2019 |
| CN | 109817829 A | 5/2019 |
| CN | 109980127 A | 7/2019 |
| CN | 110164323 A | 8/2019 |
| CN | 110176550 A | 8/2019 |
| CN | 110491914 A | 11/2019 |

OTHER PUBLICATIONS

Xiaoliang Zeng, et al."A Combination of Boron Nitride Nanotubes and Cellulose Nanofibers for the Preparation of a Nanocomposite with High Thermal Conductivity"; ACS Nano; Apr. 12, 2017.

* cited by examiner

OLED DEVICE STRUCTURE AND MANUFACTURING METHOD THEREOF

FIELD OF INVENTION

The present invention relates to the field of organic light emitting diodes (OLEDs), and in particular, to an OLED device structure and a manufacturing method thereof.

BACKGROUND OF INVENTION

Organic light emitting diode (OLED) devices have been considered as the next generation of new display technologies in the display industry because of their advantages of light weight, wide viewing angles, fast response times, low temperature resistance, and high luminous efficiency compared with traditional liquid crystal display (LCD). In particular, OLEDs can be made into flexible displays that can be bent on flexible substrates, which are a huge advantage of OLED display panels.

FIG. 1a is a basic structure of a current OLED panel 10, comprising a foam copper foil 11, a backplane 12 (used to protect an OLED display panel), a flexible substrate layer 2, an array segment film layer 3, an organic light emitting layer 4, a thin film packing layer 5, a touch layer 6, a polarizer 7, and a glass cover 8.

However, during a manufacturing process, the current OLED panel has following problems:

1. The commonly used backplane 12 has poor light penetration (average penetration rate is less than 60%) and cannot meet high light transmittance requirements for OLED devices of future under-screen cameras (FIG. 1b).

2. Adhesion between the backplane 12 and the flexible substrate 2 is poor, which causes the OLED panels to easily peel off after module manufacturing processes.

3. The backplane 12 is a polymer material, and its thermal conductivity is poor, and the thermal conductivity is about 0.1 to 0.2 W/mK. It is impossible to dissipate heat generated by circuits under the OLED devices while operating, which can easily cause the OLED device to entirely fail.

4. When bonding with the glass cover 8 (such as a hyperboloid or quadric surface), because of a low mechanical strength of backplane materials, it is easy to break at a bending area.

Therefore, it is necessary to solve the above problems and enhance competitiveness and yield of the OLED devices.

Technical Problem

Current OLED panels have following problems:

1. A commonly used backplane 12 has poor light penetration (average penetration rate is less than 60%) and cannot meet high light transmittance requirements for OLED devices of future under-screen cameras (FIG. 1b).

2. Adhesion between a backplane 12 and a flexible substrate 2 is poor, which causes the OLED panels to easily peel off after module manufacturing processes.

3. The backplane 12 is a polymer material, and its thermal conductivity is poor, and the thermal conductivity is about 0.1 to 0.2 W/mK. It is impossible to dissipate heat generated by circuits under the OLED devices while operating, which can easily cause the OLED device to entirely fail.

4. When bonding with a glass cover 8 (such as a hyperboloid or quadric surface), because of a low mechanical strength of backplane materials, it is easy to break at a bending area.

Therefore, it is necessary to solve the above problems and enhance competitiveness and yield of the OLED devices.

Technical Solution

In order to solve the above technical problems, an objective of the present invention is to provide an organic light emitting diode (OLED) device structure and a manufacturing method thereof, which can solve the problems of low penetration rate, poor heat dissipation, buffer layers are easy to peel, and easy breakage in backplane layers of current OLED panels.

In order to achieve the above objective, the present invention provides an OLED device structure comprising a base layer, an array segment film layer, an organic light emitting layer, and a thin film packing layer disposed sequentially from bottom to top; a touch layer, a polarizer, and a cover glass sequentially disposed above the thin film packing layer; a composite material layer disposed under the base layer; and a foam copper foil layer disposed under the composite material layer.

In an embodiment of the present invention, the base layer is a flexible base layer.

In an embodiment of the present invention, the composite material layer comprises a boron nitride nanosheet-nanocellulose composite material.

In an embodiment of the present invention, a boron nitride nanosheet is present in the boron nitride nanosheet-nanocellulose composite material by an amount greater than 0.1 wt % and less than 7 wt %.

In an embodiment of the present invention, a material of the composite material layer is formed by spraying, spin coating or inkjet printing processes.

In order to achieve the above objective, the present invention further provides a manufacturing method of the OLED device structure, comprising following steps:

providing a base layer;

forming an array segment film layer, an organic light emitting layer, and a thin film packing layer on the base layer sequentially;

forming a touch layer and a polarizer on the thin film packing layer sequentially;

forming a composite material layer under the base layer; and forming a foam copper foil layer under the composite material layer and forming a cover glass on the polarizer.

In an embodiment of the present invention, the base layer is a flexible base layer.

In an embodiment of the present invention, the composite material layer comprises a boron nitride nanosheet-nanocellulose composite material.

In an embodiment of the present invention, a boron nitride nanosheet is present in the boron nitride nanosheet-nanocellulose composite material by an amount greater than 0.1 wt % and less than 7 wt %.

In an embodiment of the present invention, a material of the composite material layer is formed by spraying, spin coating or inkjet printing processes.

In order to make the above contents of the present invention more comprehensible, preferred embodiments are described below in conjunction with attached drawings, which are described in detail as follows.

Beneficial Effect

The present invention provides an organic light emitting diode (OLED) device structure and a manufacturing method thereof, which can solve problems of low penetration rate, poor heat dissipation, buffer layers are easy to peel, and easy breakage in backplane layers of current OLED panels.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

In the figures, units having similar structures are used for the same reference numbers.

Figure 1A:
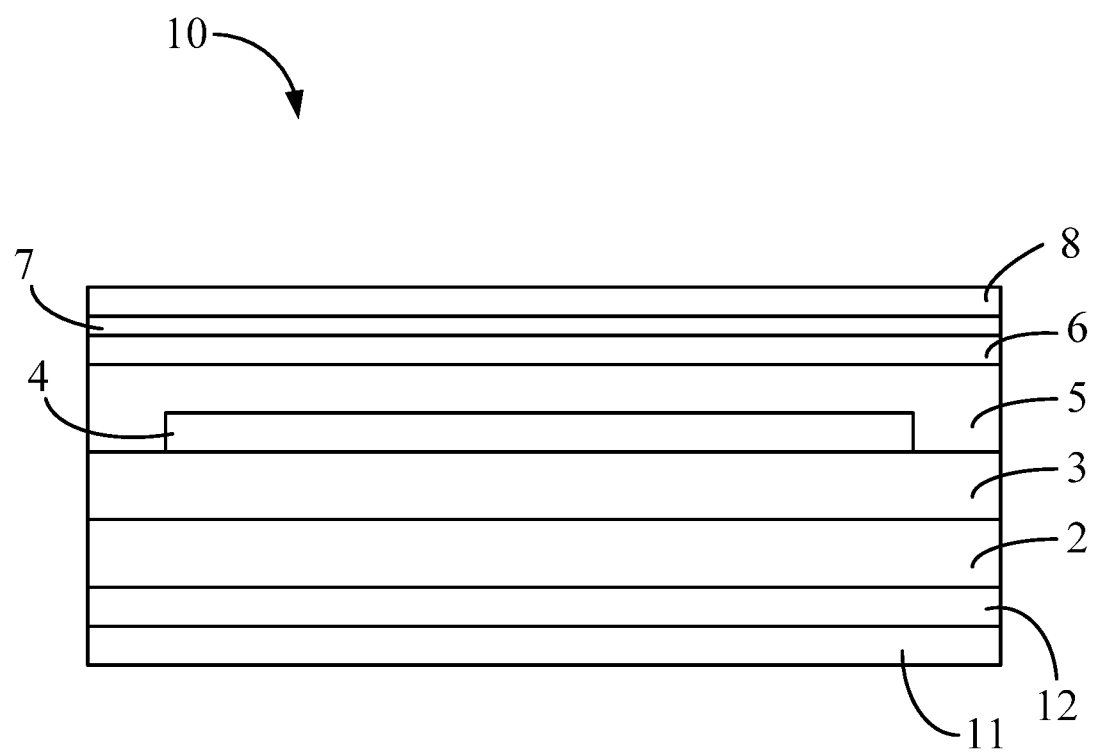
FIG. 1a is a schematic structural view of a current organic light emitting diode (OLED) panel.
Figure 1B:
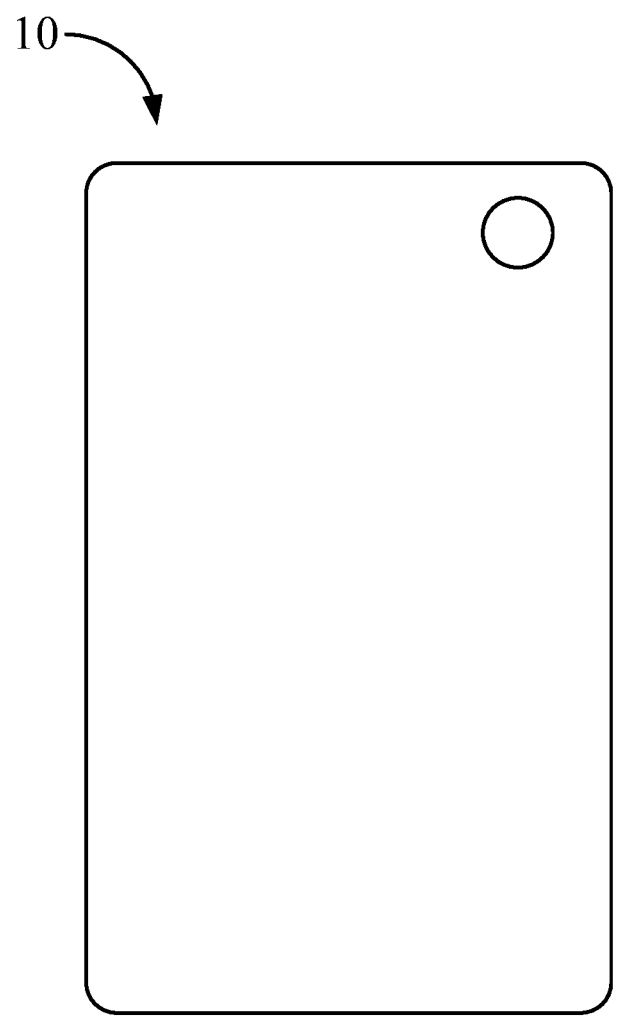
FIG. 1b is a schematic view of the current OLED panel used to install an under-screen camera.
Figure 2:
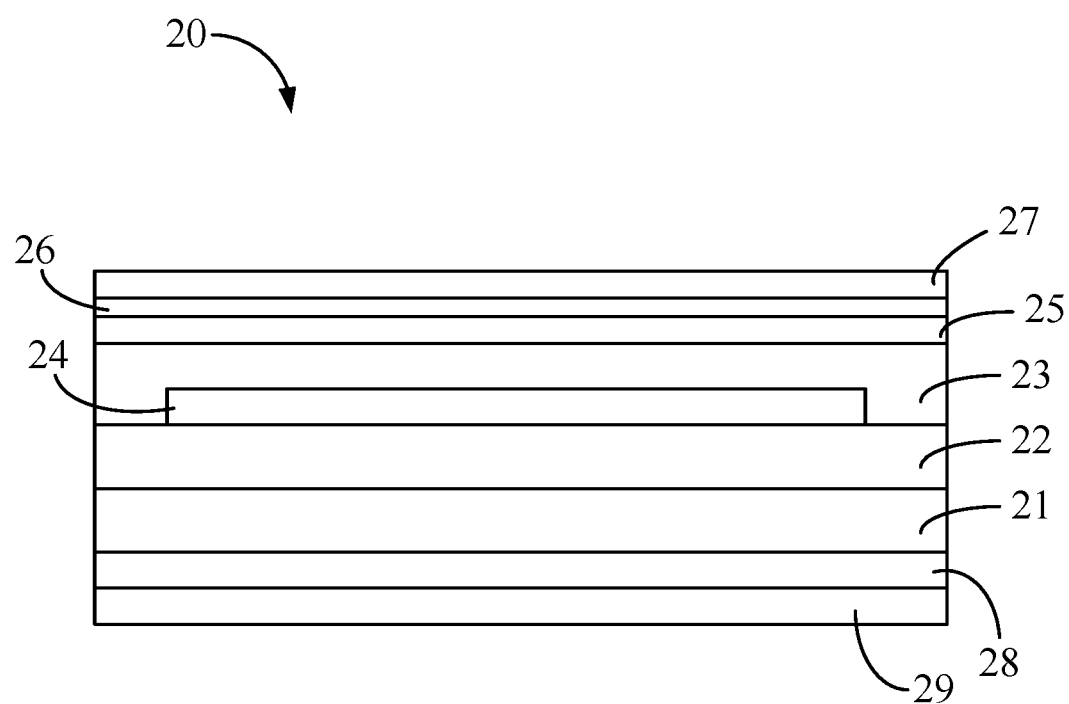
FIG. 2 is a schematic structural view of a structure of an OLED device of the present invention.

As shown in FIG. 2, an objective of the present invention is to provide an organic light emitting diode (OLED) device structure 20 comprising a base layer 21, an array segment film layer 22, an organic light emitting layer 23, and a thin film packing layer 24 disposed sequentially from bottom to top; a touch layer 25, a polarizer 26, and a cover glass 27 sequentially disposed above the thin film packing layer 24; a composite material layer 28 disposed under the base layer 21; and a foam copper foil layer 29 disposed under the composite material layer 28.

The base layer 21 is a flexible base layer. The composite material layer 28 comprises a boron nitride nanosheet-nanocellulose composite material. A boron nitride nanosheet is present in the boron nitride nanosheet-nanocellulose composite material by an amount greater than 0.1 wt % and less than 7 wt %, and with less than 5 wt % being best.

In detail, replacing a backplane 12 used in the prior art with the composite material layer 28 of the present invention will have following advantages:

1. When the amount of the boron nitride nanosheets is 5%, a penetration of the composite material layer 28 can reach more than 80%. Therefore, the penetration of the composite material layer 28 will be more than 33.3% higher than that of a traditional backplane material (backplane material penetration is less than 60%), which can greatly improve an overall light transmittance of the OLED device, making it more suitable for a development trend of under-screen cameras.

In addition, a light transmittance of traditional backplane materials in a blue light band (400 nm to 450 nm) is basically 0, which cannot meet a requirement of the under-screen cameras for full-band light, that is, the under-screen cameras cannot perceive blue light, and cannot generate images normally. However, the boron nitride nanosheet-nanocellulose composite material of the composite material layer 28 of the present invention has a high light transmittance (more than 60%) in the blue light band, so normal imaging of the under-screen cameras can be guaranteed.

2. The base layer 21 is an organic substance, and a surface is rich in hydrophilic groups. However, a nano-cellulose surface of the boron nitride nanosheet-nanocellulose composite material in the composite material layer 28 is also rich with a large number of hydrophilic group hydroxyl groups, which can greatly improve adhesion between the two at an interface of the film layer, thereby effectively avoiding peeling problems of flexible substrates and backplane materials in the prior art.

3. The boron nitride nanosheet of the boron nitride nanosheet-nanocellulose composite material in the composite material layer 28 has a high thermal conductivity. When the amount of the boron nitride nanosheet is 5%, the thermal conductivity of the boron nitride nanosheet-nanocellulose can reach 26.2 W/mK, which is much higher than a thermal conductivity of the backplane material (about 0.1 to 0.2 W/mK), which can effectively solve heat dissipation problems of the OLED devices.

4. When the amount of the boron nitride nanosheet of the boron nitride nanosheet-nanocellulose composite material in the composite material layer 28 is 5%, it still maintains ultra-high mechanical properties, and its tensile stress is close to 200 MPa, so that it will not break during bending and fitting.

Figure 3:
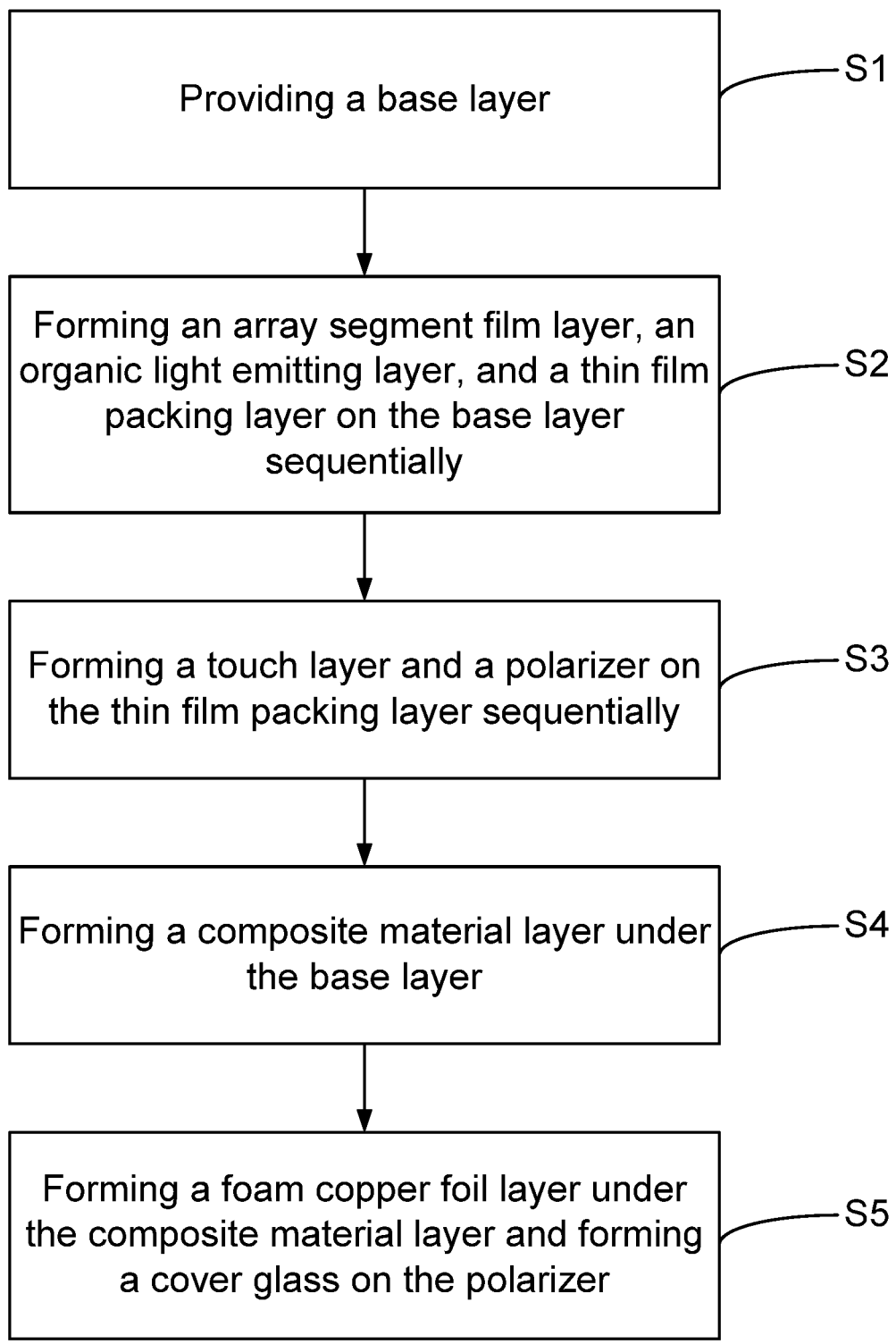
FIG. 3 is a flowchart of a manufacturing method of the OLED device structure of the present invention.
Figure 4:
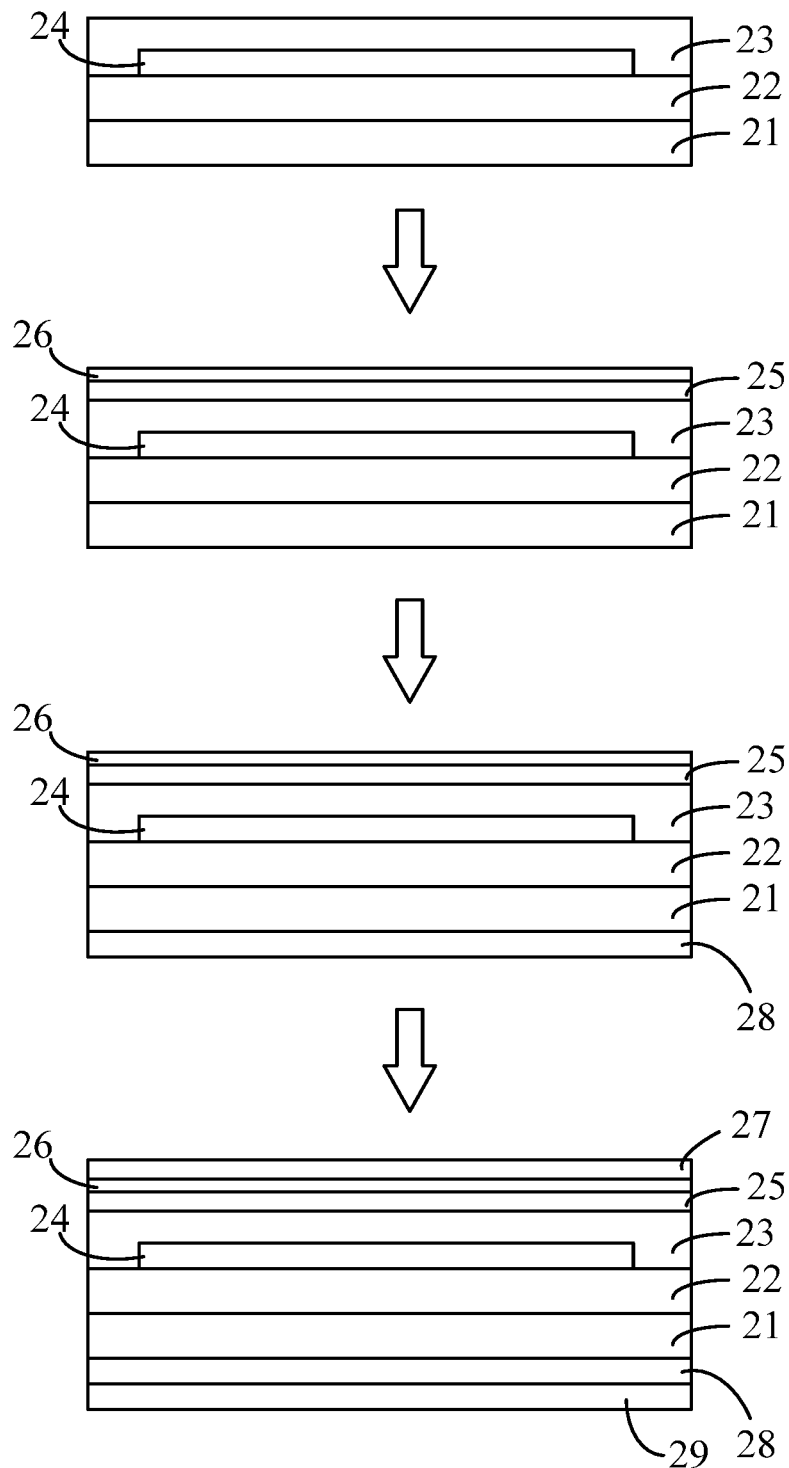
FIG. 4 is a schematic view of a manufacturing process of the OLED device structure of the present invention.

As shown in FIG. 3 and FIG. 4, which are flowcharts of a manufacturing method of the OLED device structure 20 of the present invention and a schematic view of a manufacturing process of the OLED device structure of the present invention, the manufacturing method of the OLED device structure comprises following steps:

S1. Providing the base layer 21;

S2. Forming the array segment film layer 22, the organic light emitting layer 23, and the thin film packing layer 24 on the base layer 21 sequentially;

S3. Forming the touch layer 25 and the polarizer 26 on the thin film packing layer 24 sequentially;

S4. Forming the composite material layer 28 under the base layer 21; and

S5. Forming the foam copper foil layer 29 under the composite material layer 28 and forming the cover glass 27 on the polarizer 26.

The base layer 21 is a flexible base layer. The composite material layer 28 comprises boron nitride nanosheet-nanocellulose composite material. The boron nitride nanosheet is present in the boron nitride nanosheet-nanocellulose composite material by an amount greater than 0.1 wt % and less than 7 wt %, and with less than 5 wt % being best.

When the composite material layer 28 is formed under the base layer 21, the processes used include, but are not limited to, spraying, spin coating or inkjet printing, etc.

On the other hand, structures of the touch layer 25, the polarizer 26, the foam copper foil layer 29, and the cover glass 27 can be formed according to current procedures, so the present invention can be introduced into current manufacturing processes in a most economical manner.

Figure 5:
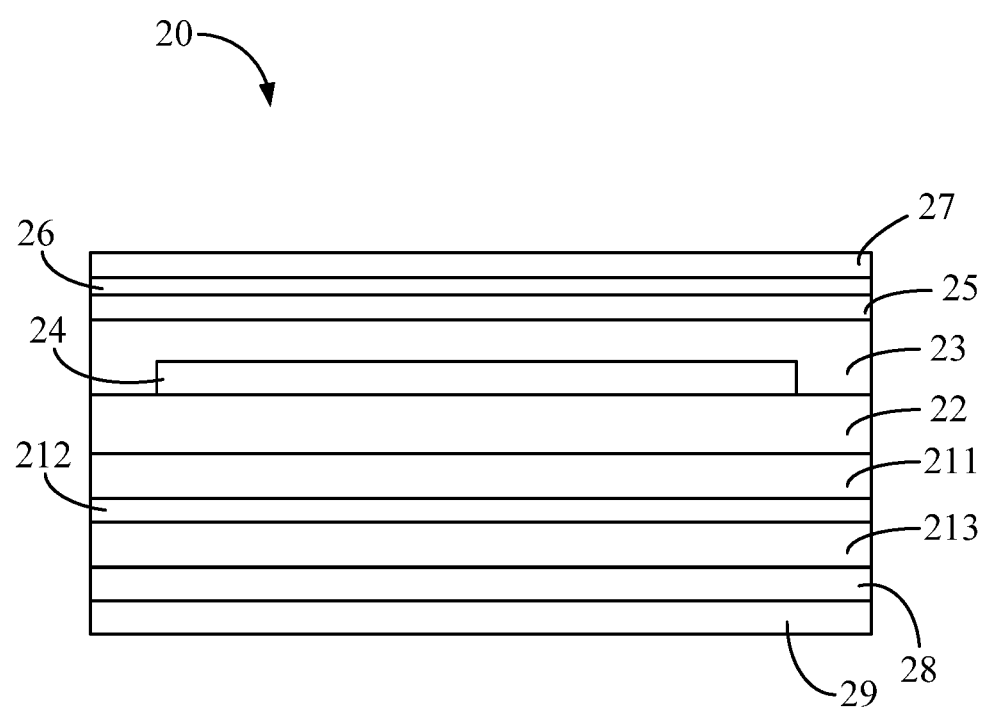
FIG. 5 is a schematic view of another embodiment of the structure of the OLED device of the present invention.

As shown in FIG. 5, in another embodiment of the present invention, the base layer 21 may be further configured as a double flexible base layer and a single buffer layer. That is, the base layer 21 is distinguished into a first flexible base layer 211, a buffer layer 212, and a second flexible base layer 213, and the present invention can also be introduced into the current manufacturing processes in the most economical manner.

Replacing the backplane 12 used in the prior art with the composite material layer 28 of the present invention will have following advantages:

1. When the amount of the boron nitride nanosheets is 5%, a penetration of the composite material layer 28 can reach more than 80%. Therefore, the penetration of the composite material layer 28 will be more than 33.3% higher than that of a traditional backplane material (backplane material penetration is less than 60%), which can greatly improve an overall light transmittance of the OLED device, making it more suitable for a development trend of under-screen cameras.

In addition, a light transmittance of traditional backplane materials in a blue light band (400 nm to 450 nm) is basically 0, which cannot meet a requirement of the under-screen cameras for full-band light, that is, the under-screen cameras cannot perceive blue light, and cannot generate images normally. However, the boron nitride nanosheet-nanocellulose composite material of the composite material layer 28 of the present invention has a high light transmittance (more than 60%) in the blue light band, so normal imaging of the under-screen cameras can be guaranteed.

2. The base layer 21 is an organic substance, and a surface is rich in hydrophilic groups. However, a nano-cellulose surface of the boron nitride nanosheet-nanocellulose composite material in the composite material layer 28 is also rich with a large number of hydrophilic group hydroxyl groups, which can greatly improve adhesion between the two at an interface of the film layer, thereby effectively avoiding peeling problems of flexible substrates and backplane materials in the prior art.

3. The boron nitride nanosheet of the boron nitride nanosheet-nanocellulose composite material in the composite material layer 28 has a high thermal conductivity. When the amount of the boron nitride nanosheet is 5%, the thermal conductivity of the boron nitride nanosheet-nanocellulose can reach 26.2 W/mK, which is much higher than the thermal conductivity of the backplane material (about 0.1 to 0.2 W/mK), which can effectively solve heat dissipation problems of the OLED devices.

4. When the amount of the boron nitride nanosheet of the boron nitride nanosheet-nanocellulose composite material in the composite material layer 28 is 5%, it still maintains ultra-high mechanical properties, and its tensile stress is close to 200 MPa, so that it will not break during bending and fitting.

In this way, the OLED device structure and the manufacturing method thereof of the present invention can solve the problems of low penetration rate, poor heat dissipation, buffer layers are easy to peel, and easy breakage in backplane layers of current OLED panels.

The above are only preferred embodiments of the present invention. It should be noted that for those of ordinary skill in the art, without departing from principles of the present invention, a number of improvements and retouches can be made, and these improvements and retouches should also be considered as the scope of protection of the present invention.

What is claimed is:

1. An organic light emitting diode (OLED) device structure, comprising:
    a base layer, an array segment film layer, an organic light emitting layer, and a thin film packing layer disposed sequentially from bottom to top;
    a touch layer, a polarizer, and a cover glass sequentially disposed above the thin film packing layer;
    a composite material layer disposed under the base layer; and
    a foam copper foil layer disposed under the composite material layer.

2. The OLED device structure as claimed in claim 1, wherein the base layer is a flexible base layer.

3. The OLED device structure as claimed in claim 2, wherein the composite material layer comprises a boron nitride nanosheet-nanocellulose composite material.

4. The OLED device structure as claimed in claim 3, wherein a boron nitride nanosheet is present in the boron nitride nanosheet-nanocellulose composite material by an amount greater than 0.1 wt % and less than 7 wt %.

5. The OLED device structure as claimed in claim 1, wherein a material of the composite material layer is formed by spraying, spin coating or inkjet printing processes.

6. A manufacturing method of an organic light emitting diode (OLED) device structure, comprising following steps:
    providing a base layer;
    forming an array segment film layer, an organic light emitting layer, and a thin film packing layer on the base layer sequentially;
    forming a touch layer and a polarizer on the thin film packing layer sequentially;
    forming a composite material layer under the base layer; and
    forming a foam copper foil layer under the composite material layer and forming a cover glass on the polarizer.

7. The manufacturing method as claimed in claim 6, wherein the base layer is a flexible base layer.

8. The manufacturing method as claimed in claim 7, wherein the composite material layer comprises a boron nitride nanosheet-nanocellulose composite material.

9. The manufacturing method as claimed in claim 8, wherein a boron nitride nanosheet is present in the boron nitride nanosheet-nanocellulose composite material by an amount greater than 0.1 wt % and less than 7 wt %.

10. The manufacturing method as claimed in claim 6, wherein a material of the composite material layer is formed by spraying, spin coating or inkjet printing processes.

* * * * *